United States Patent
Hasan et al.

(10) Patent No.: US 11,906,555 B2
(45) Date of Patent: Feb. 20, 2024

(54) HYBRID INDUCTOR CURRENT MONITORING FOR POWER SWITCH

(71) Applicant: Semiconductor Components Industries, LLC, Phoenix, AZ (US)

(72) Inventors: Mahbub Hasan, Chandler, AZ (US); Yue Hung Tang, Caotun Township (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 183 days.

(21) Appl. No.: 17/658,387

(22) Filed: Apr. 7, 2022

(65) Prior Publication Data
US 2023/0324441 A1 Oct. 12, 2023

(51) Int. Cl.
*G01R 19/257* (2006.01)
*H02M 1/00* (2006.01)

(52) U.S. Cl.
CPC ........ *G01R 19/257* (2013.01); *H02M 1/0009* (2021.05)

(58) Field of Classification Search
CPC .... G01R 19/257; H02M 1/0009; H02M 3/158
USPC ...................... 324/108, 107, 76.11
See application file for complete search history.

(56) References Cited

U.S. PATENT DOCUMENTS

| | | |
|---|---|---|
| 2014/0361775 A1 | 12/2014 | Tateishi et al. |
| 2015/0222171 A1 | 8/2015 | Nguyen et al. |
| 2021/0328509 A1* | 10/2021 | Tseng .................. H02M 1/0009 |
| 2022/0099712 A1* | 3/2022 | De Fazio ............ H02M 1/0009 |
| 2022/0236307 A1* | 7/2022 | Gray ........................ H03K 5/24 |

* cited by examiner

*Primary Examiner* — Giovanni Astacio-Oquendo
(74) *Attorney, Agent, or Firm* — Dickinson Wright PLLC; Jonathan A. Schnaver

(57) ABSTRACT

Methods and systems for emulating high side current of a power switch including low and high side switches. The method includes generating, with a low side current sensor, a low side current signal for the low side switch when the power switch is in a low state. The method also includes generating, with a first transconductance amplifier, an emulated current signal based on an input voltage of the power switch. The method further includes generating, with a buffer, a fixed reference voltage by sampling the low side current signal when the power switch changes from the low state to a high state. The method also includes generating, with a capacitor, an emulated voltage based on the emulated current signal and the fixed reference voltage. The method further includes, generating, with a second transconductance amplifier, a high side current signal for the high side switch based on the emulated voltage.

20 Claims, 6 Drawing Sheets

HYBRID INDUCTOR CURRENT MONITORING FOR POWER SWITCH

BACKGROUND

In power supplies for graphics processing unit (GPU) or central processing unit (CPU) applications, the duty cycle of the pulse-width modulation (PWM) of a buck power convertor is small due to the ratio of the input voltage and the output voltage. Conventional inductor current monitoring systems have a large phase delay for small PWM duty control, and in particular, high side current information. This phase delay can adversely impact the control of operations such as current balance, phase shedding, and loop control.

SUMMARY

The present disclosure provides a hybrid inductive current monitor for a power switch that combines a high side current emulator and a low side current sensor. More particularly, the high side current emulator provided herein utilizes low side current information from the low side current sensor to perform auto-correction with the high side current emulator cycle-by-cycle. The start time of the high side current emulator is from the rising edge of the high side gate of the power switch. Thus, the high side current emulator provided herein generates high side current information without the phase delay present in conventional inductor current monitoring systems.

The present disclosure provides a method for emulating a high side current of a power switch including a low side switch and a high side switch. The method includes generating, with a low side current sensor, a low side current signal for the low side switch when the power switch is in a low state. The method also includes generating, with a first transconductance amplifier, an emulated current signal based on an input voltage of the power switch. The method further includes generating, with a buffer, a fixed reference voltage by sampling the low side current signal when the power switch changes from the low state to a high state. The method also includes generating, with an emulator capacitor, an emulated voltage based on the emulated current signal and the fixed reference voltage. The method further includes, generating, with a second transconductance amplifier, a high side current signal for the high side switch based on the emulated voltage. In some implementations, the method also includes adjusting, with a controller, a transconductance of the first transconductance amplifier based on a difference between the high side current signal and the low side current signal when the power switch changes from the high state to the low state. In other implementations, the method also includes adjusting, with a controller, a capacitance of the emulator capacitor based on a difference between the high side current signal and the low side current signal when the power switch changes from the high state to the low state.

The present disclosure also provides a system for emulating a high side current of a power switch including a low side switch and a high side switch. The system includes, in one implementation, a low side current sensor and a high side current emulator. The low side current sensor is configured to generate a low side current signal for the low side switch when the power switch is in a low state. The high side current emulator includes, in one implementation, a first transconductance amplifier, a buffer, an emulator capacitor, and a second transconductance amplifier. The first transconductance amplifier is configured to generate an emulated current signal based on an input voltage of the power switch. The buffer is configured to generate a fixed reference voltage by sampling the low side current signal when the power switch changes from the low state to a high state. The emulator capacitor is configured to generate an emulated voltage based on the emulated current signal and the fixed reference voltage. The second transconductance amplifier is configured to generate a high side current signal for the high side switch based on the emulated voltage. In some implementations, the system further includes a controller configured to adjust a transconductance of the first transconductance amplifier based on a difference between the high side current signal and the low side current signal when the power switch changes from the high state to the low state. In other implementations, the system further includes a controller configured to adjust a capacitance of the emulator capacitor based on a difference between the high side current signal and the low side current signal when the power switch changes from the high state to the low state.

The present disclosure further provides a power switch including, in one implementation, a low side switch, a high side switch, a low side current sensor, and a high side current emulator. The low side current sensor is configured to generate a low side current signal for the low side switch when the power switch is in a low state. The high side current emulator is configured to generate an emulated current signal based on an input voltage of the power switch. The high side current emulator is also configured to generate a fixed reference voltage by sampling the low side current signal when the power switch changes from the low state to a high state. The high side current emulator is further configured to generate an emulated voltage based on the emulated current signal and the fixed reference voltage. The high side current emulator is also configured to generate a high side current signal for the high side switch based on the emulated voltage. In some implementations, the high side current emulator includes a transconductance amplifier configured to generate the emulated current signal and the high side current emulator is further configured to adjust a transconductance of the transconductance amplifier based on a difference between the high side current signal and the low side current signal when the power switch changes from the high state to the low state. In other implementations, the high side current emulator includes an emulator capacitor configured to generate the emulated voltage and the high side current emulator is further configured to adjust a capacitance of emulator capacitor based on a difference between the high side current signal and the low side current signal when the power switch changes from the high state to the low state.

BRIEF DESCRIPTION OF THE DRAWINGS

For a detailed description of example implementations, reference will now be made to the accompanying drawings in which.

DEFINITIONS

Figure 1:
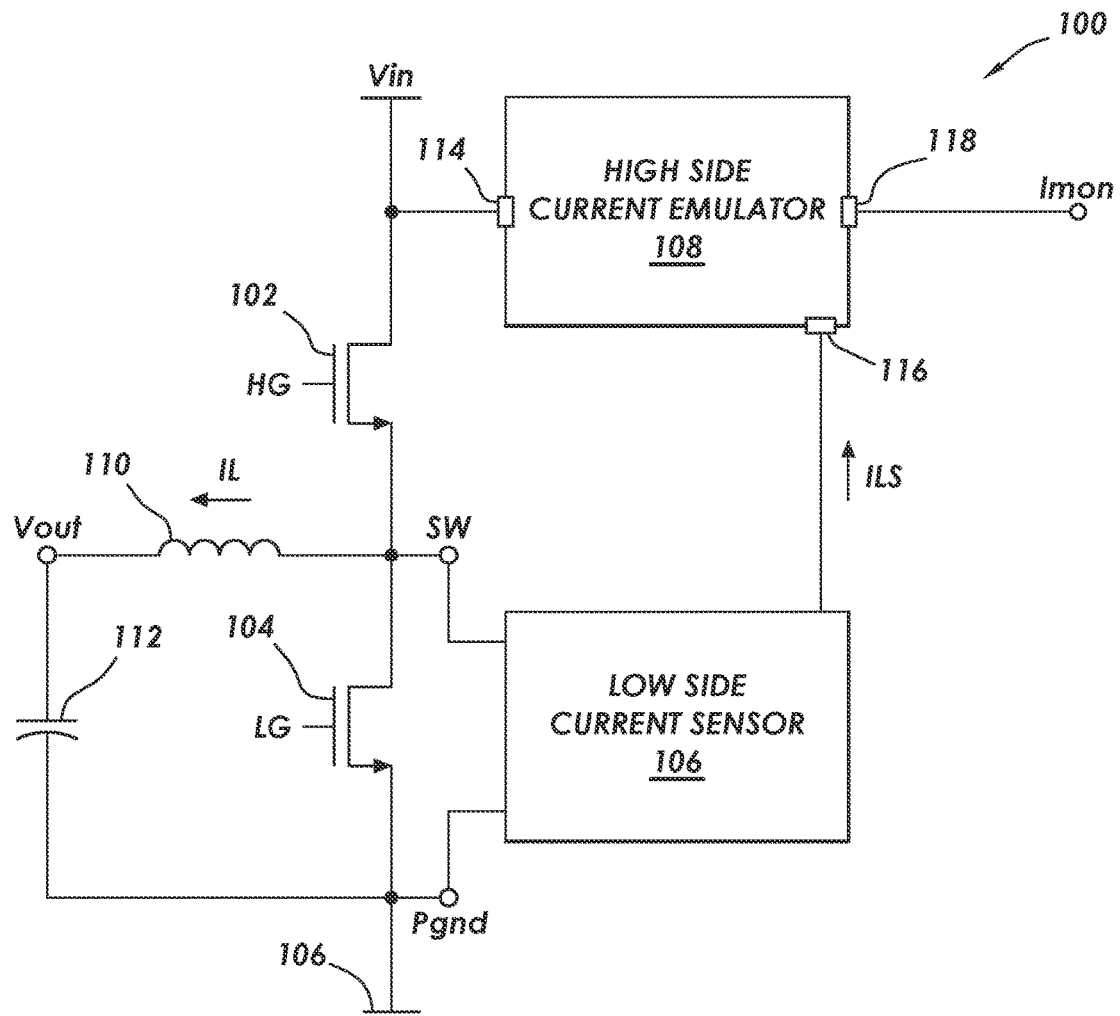
FIG. 1 is a partial schematic and a partial block diagram of an example of a power switch with high side current emulation in accordance with some implementations.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

The terms "input" and "output" when used as nouns refer to connections (e.g., electrical, software), and shall not be read as verbs requiring action. For example, a timer circuit may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Controller" shall mean, alone or in combination, individual circuit components, an application specific integrated circuit (ASIC), a microcontroller with controlling software, a reduced-instruction-set computing (RISC), a digital signal processor (DSP), a processor with controlling software, a programmable logic device (PLD), or a field programmable gate array (FPGA), configured to read inputs and drive outputs responsive to the inputs.

DETAILED DESCRIPTION

The following discussion is directed to various implementations of the invention. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the present disclosure, including the claims, is limited to that implementation.

Various examples are directed to power switches with high side current emulators and low side current sensors. More particularly, various examples are directed to high side current emulators that generate a fixed reference voltage to emulate high side current. In addition, various examples are directed to high side current emulators and related controllers that use closed loop feedback to emulate high side current. The specification now turns to an example system to orient the reader.

FIG. 1 is a partial schematic and a partial block diagram of an example of a power switch 100 in accordance with some implementations. The power switch 100 illustrated in FIG. 1 includes a high side switch 102, a low side switch 104, a low side current sensor 106, and a high side current emulator 108. The power switch 100 illustrated in FIG. 1 is provided as one example of such an apparatus. The methods described herein may be used with apparatuses having fewer, additional, or different components in different configurations than the power switch 100 illustrated in FIG. 1. For example, the high side switch 102 and the low side switch 104 are illustrated in FIG. 1 as metal-oxide-semiconductor field-effect transistors (MOSFETs), and in particular, N-channel MOSFETs. However, other types of FETs may be used (e.g., P-channel MOSFETs), and in fact other types of transistors may also be used (e.g., bi-polar junction transistors (BJTs)). Further, in some implementations, the low side current sensor 106 and the high side current emulator 108 are separate components (as illustrated in FIG. 1). In alternate implementations, the low side current sensor 106 and the high side current emulator 108 may be part of the same component. For example, the low side current sensor 106 and the high side current emulator 108 may both be positioned on a single printed circuit board and/or within a single chip housing.

Figure 2:
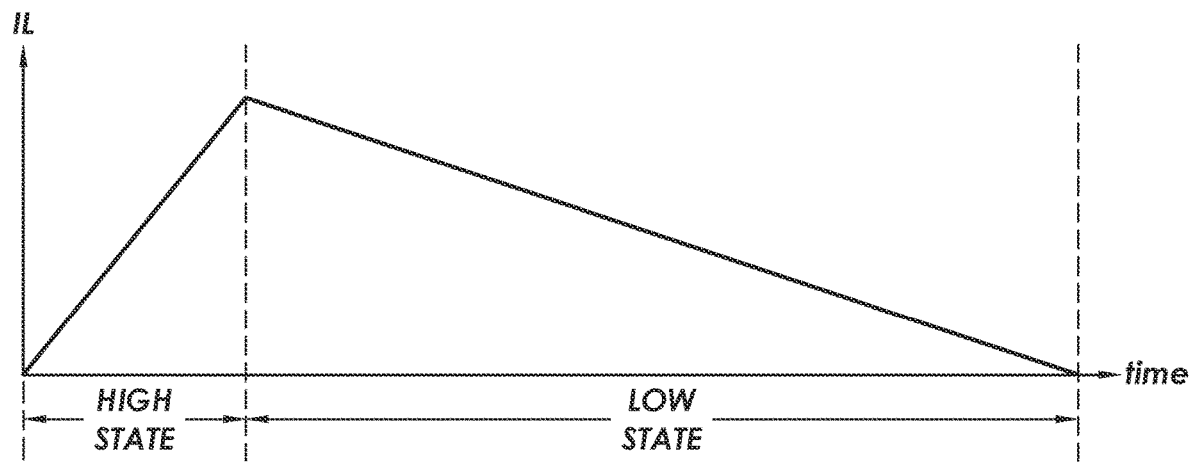
FIG. 2 is a plot of an example of inductor current behavior for a power switch during a high state and a low state in accordance with some implementations.

The power switch 100 is configured to switch back and forth between a high state and a low state. In the high state, the high side switch 102 is closed, the low side switch 104 is open, and the inductor current IL at switching port SW increases, as illustrated in FIG. 2. In the low state, the high side switch 102 is open, the low side switch 104 is closed, and the inductor current IL at switching port SW decreases, as also illustrated in FIG. 2. Returning to FIG. 1, switching port SW of the power switch 100 is coupled to an inductor 110 coupled in series with a capacitor 112 to generate an output voltage Vout based on the inductor current IL at switching port SW. The low side current sensor 106 is configured to directly sense current flowing through low side switch 104. The low side current sensor 106 generates a low side current signal ILS when the power switch 100 is in the low state. The low side current signal ILS represents the amount of current flowing through the low side switch 104 when the power switch 100 is in the low state. As will be described in more detail below, the high side current emulator 108 is configured to generate a current monitoring signal Imon that represents the amount of current flowing through the power switch 100 in both the high state and the low state.

The high side current emulator 108 illustrated in FIG. 1 includes control terminal 114, control terminal 116, and output terminal 118. The example terminals are electrical connections exposed and accessible through the packaging. Additional terminals will be present (e.g., power terminal, reference voltage terminal, ground terminal), but those additional terminals are not shown so as not to unduly complicate the figure. The high side current emulator 108 receives the input voltage Vin of the power switch 100 via control terminal 114. The high side current emulator 108 also receives the low side current signal ILS from the low side current sensor 106 via control terminal 116. The high side current emulator 108 outputs the current monitoring signal Imon via output terminal 118.

Figure 3:
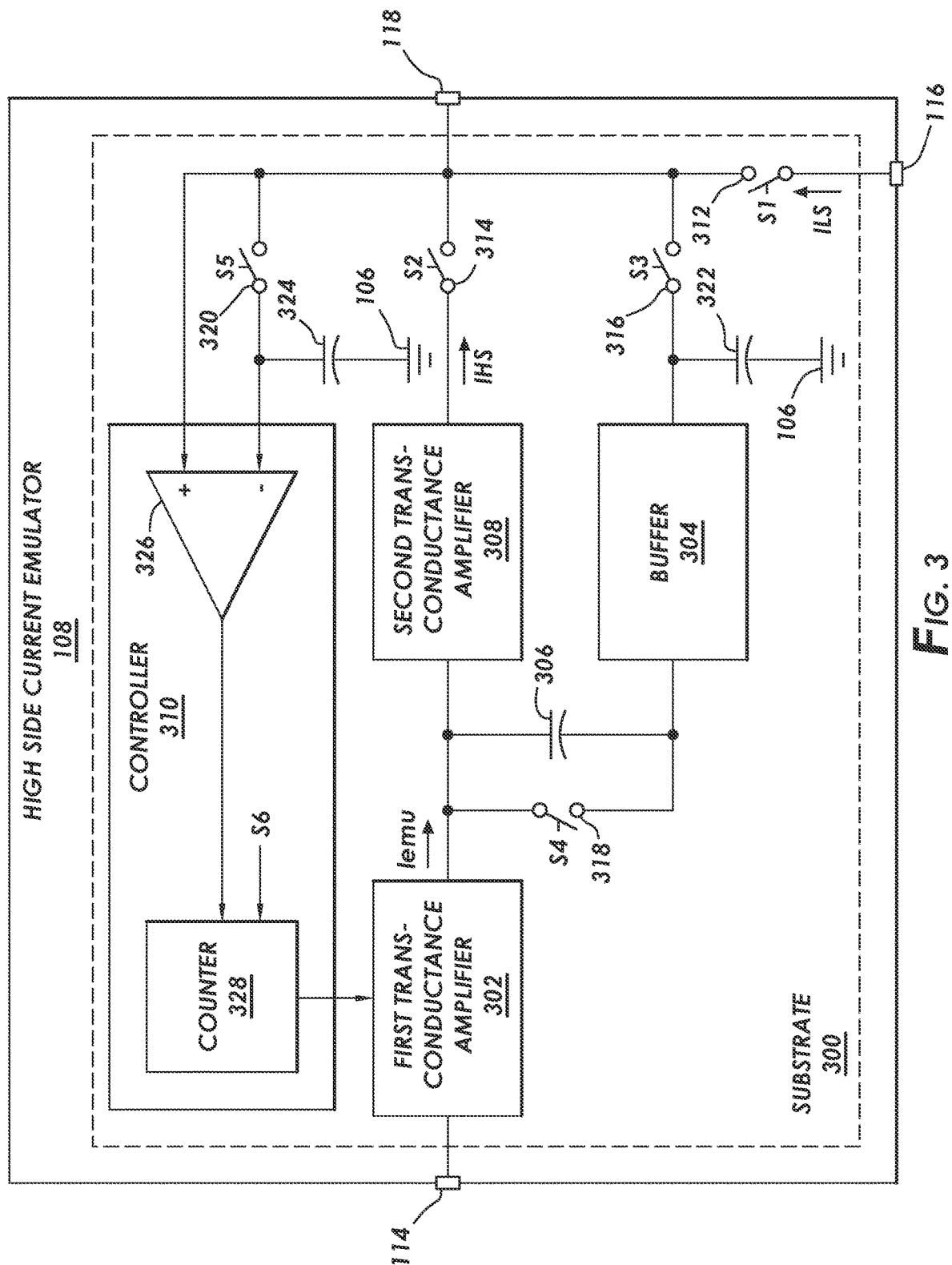
FIG. 3 is a partial schematic and a partial block diagram of an example of a high side current emulator included in the power switch of FIG. 1 in accordance with some implementations.

FIG. 3 is a partial schematic and a partial block diagram of an example of the high side current emulator 108 in accordance with some implementations. In particular, the high side current emulator 108 may comprise electrical devices and circuits monolithically created on a substrate 300 and encapsulated within packaging; however, the functionality of the various components may be embodied on multiple substrates that are co-packaged (e.g., multi-chip module) and electrically coupled to each other and coupled to the various terminals. The high side current emulator 108 illustrated in FIG. 3 includes a first transconductance amplifier 302, a buffer 304, an emulator capacitor 306, a second transconductance amplifier 308, a controller 310, a first switch 312, a second switch 314, a third switch 316, a fourth switch 318, and a fifth switch 320.

Figure 4:
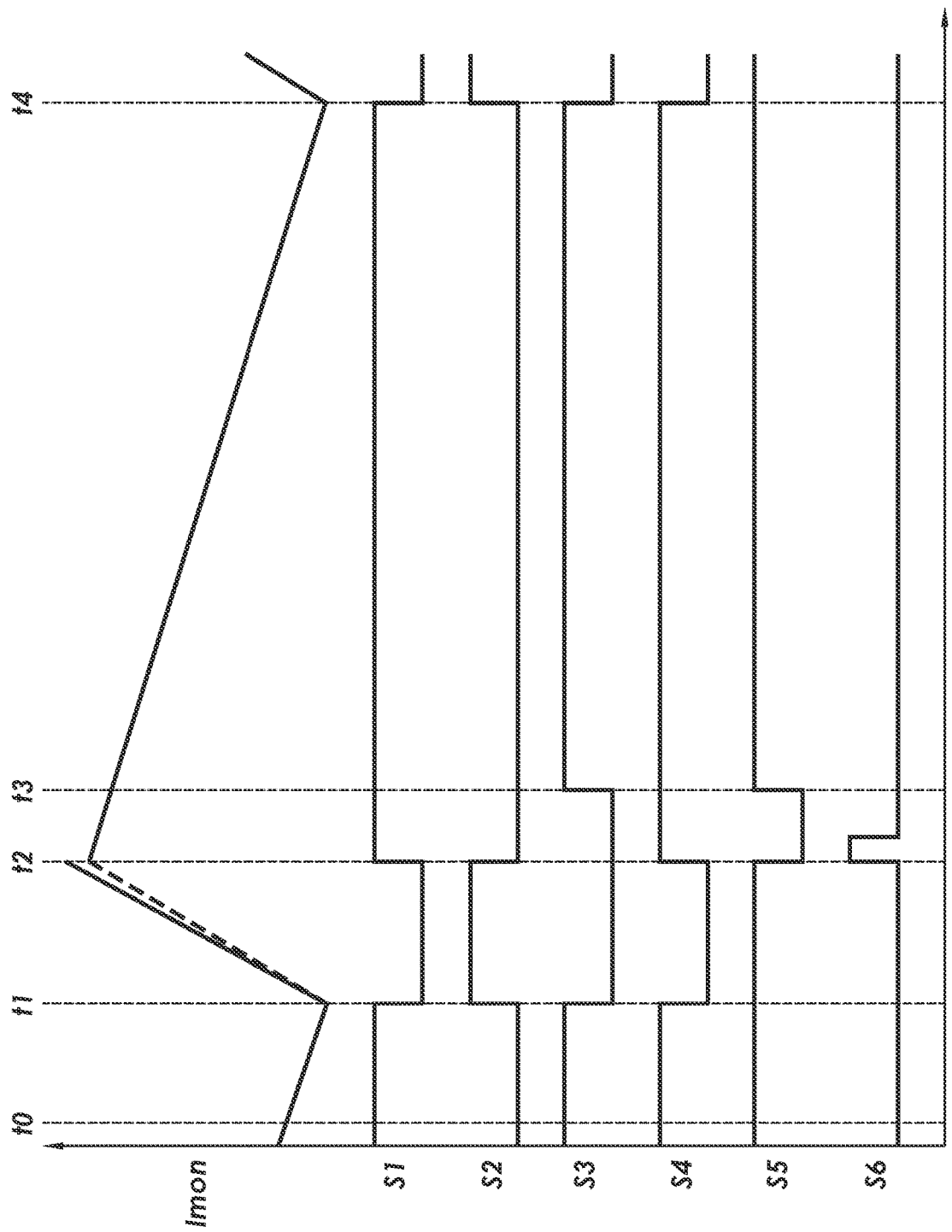
FIG. 4 is a timing diagram of example operation of a power switch with high side current emulation in accordance with some implementations.

The first transconductance amplifier 302 is configured to generate an emulated current signal Iemu based on the input voltage Vin of the power switch 100. The buffer 304 is included to provide a fixed reference voltage for the emulator capacitor 306 because, as described above, the current at switching port SW is not fixed when the power switch 100 is in the high state. In particular, the buffer 304 is configured to generate a fixed reference voltage by sampling the low side current signal ILS (terminated on an external resistor) when the power switch 100 changes from the low state to the high state. For example, with reference to FIG. 4, at time t0, the power switch 100 is in the low state, the first switch 312 and the third switch 316 are both closed, and the low side current signal ILS forms a voltage on a first reference capacitor 322. At time t1, the power switch 100 changes from the low state to the high state, and the first switch 312 and the third switch 316 are both open such that the voltage present on the first reference capacitor 322 represents the low side current signal ILS when the power switch 100 changes from the low state to the high state. This voltage is provided to the buffer 304 and the buffer 304 generates a fixed reference voltage corresponding to the low side current signal ILS when the power switch 100 changes from the low state to the high state. As illustrated in FIG. 4, the buffer 304 continues to generate the fixed reference voltage until time t3 when the power switch 100 is back in the low state. In this manner, each time the power switch 100 is in the high state, the buffer 304 generates an updated fixed reference voltage corresponding to the low side current signal ILS when the power switch 100 changed to the high state from the immediately previous low state.

The emulator capacitor 306 generates an emulated voltage based on the emulated current signal Iemu and the fixed reference voltage. In particular, the emulated current signal Iemu charges the emulator capacitor 306 which causes the emulator capacitor 306 to generate an emulated voltage that increases as the charge level of the emulator capacitor 306 increases. As illustrated in FIG. 4, the fourth switch 318 is closed when the power switch 100 is in the low state and open when the power switch 100 is in the high state. The fourth switch 318 is closed during the low state to discharge the emulator capacitor 306.

The second transconductance amplifier 308 is configured to generate a high side current signal IHS for the high side switch 102 based on the emulated voltage. As illustrated in FIG. 4, the first switch 312 is open and the second switch 314 is closed when the power switch 100 is in the high state (e.g., between times t1 and t2). Thus, the high side current signal IHS is applied to output terminal 118 as the current monitoring signal Imon when the power switch 100 is in the high state. Also, as illustrated in FIG. 4, the first switch 312 is closed and the second switch 314 is open when the power switch 100 is in the low state (e.g., between times t2 and t4). Thus, the low side current signal ILS is applied to output terminal 118 as the current monitoring signal Imon when the power switch 100 is in the low state. By matching the current flowing through the high side switch 102 when the power switch 100 is in the high state and matching the current flowing through the low side switch 104 when the power switch 100 is in the low state, the current monitoring signal Imon matches the inductor current IL of the power switch 100 during both the high state and the low state of the power switch 100.

The high side current signal IHS does not always match the actual inductor current IL of the power switch 100. For example, between times t1 and t2 in the top plot of FIG. 4, the solid line represents the current monitoring signal Imon during the high state and the dashed line represents the actual inductor current IL of the power switch 100 during the high state. As illustrated in FIG. 4, the current monitoring signal Imon does not match the inductor current IL between times t1 and t2. Thus, in some implementations, the high side current emulator 108 includes controller 310 which uses closed loop feedback to adjust the high side current signal IHS to more closely match the actual inductor current IL of the power switch 100 during the high state. Right after the power switch 100 changes from the high state to the low state, the low side current signal ILS matches the inductor current IL. Thus, by comparing the high side current signal IHS to the low side current signal ILS when the power switch 100 changes from the high state to the low state, the controller 310 can detect when the high side current signal IHS varies from the actual inductor current IL during the high state. To this end, in some implementations, the high side current emulator 108 is configured to generate a reference high current by sampling the high side current signal IHS when the power switch 100 changes from the high state to the low state. For example, with reference to FIG. 4, between times t1 and t2, the fifth switch 320 is closed, and the high side current signal IHS forms a voltage on a second reference capacitor 324. At time t2, the power switch 100 changes from the high state to the low state, and the fifth switch 320 is open such that the voltage present on the second reference capacitor 324 represents the high side current signal IHS when the power switch 100 changes from the high state to the low state. This voltage is provided to the controller 310. As illustrated in FIG. 3, the controller 310 is further coupled to the first switch 312 to receive the low side current signal ILS. As will be described in more detail below, the controller 310 is configured to adjust the high side current signal IHS based on the difference between the reference high current and the low side current signal ILS when the power switch 100 changes from the high state to the low state.

The slope of the high side current signal IHS is set based in part on the transconductance of the first transconductance amplifier 302. Thus, in some implementations, the controller 310 is configured to adjust the transconductance of the first transconductance amplifier 302 based on the difference between the reference high current and the low side current signal ILS when the power switch 100 changes from the high state to the low state. For example, the controller 310 illustrated in FIG. 3 includes a comparator 326 and a counter 328. The second reference capacitor 324 is coupled to the inverting input of the comparator 326 to provide the reference high current thereto. The non-inverting input of the comparator 326 is coupled to control terminal 116 (via the first switch 312) to receive the low side current signal ILS therefrom. The comparator 326 generates an output that indicates whether the reference high current is greater than, equal to, or less than the low side current signal ILS. The counter 328 is coupled to the comparator 326 to receive the output of the comparator 326. When the output of the comparator 326 indicates that the reference high current is greater than the low side current signal ILS, the counter 328 decreases the transconductance of the first transconductance amplifier 302. For example, when the power switch 100 changes from the high state to the low state at time t2 in FIG. 4, the high side reference current IHS is greater than the inductor current IL. Thus, the counter 328 decreases the transconductance of the first transconductance amplifier 302 to reduce the slope of the high side reference current IHS during the next high state of the power switch 100. Alternatively, when the output of the comparator 326 indicates that the reference high current is less than the low side current signal ILS, the counter 328 increases the transconductance of the first transconductance amplifier 302. Alternatively, when the output of the comparator 326 indicates that the reference high current is equal to the low side current signal ILS, the counter 328 does not change the transconductance of the first transconductance amplifier 302. In this manner, the controller 310 adjusts the high side current signal IHS after each high state to more closely match the inductor current IL of the power switch 100 during the next high state of the power switch 100. In some implementations, the counter 328 is configured adjust the transconductance of the first transconductance amplifier 302 responsive to a trigger signal (e.g., signal S6 illustrated in FIG. 3). As illustrated in FIG. 4, signal S6 pulses when the power switch 100 changes from the high state to the low state at time t2.

In some implementations, the controller 310 may determine the difference between the reference high current and the low side current signal ILS, and adjust the transconductance based on the determined difference. For example, the controller 310 may implement a look-up table that adjusts the transconductance of the first transconductance amplifier 302 by a small amount when the difference between the reference high current and the low side current signal ILS is small and adjusts the transconductance of the first transconductance amplifier 302 by a large amount when the difference between the reference high current and the low side current signal ILS is large.

The slope of the high side current signal IHS is also set based in part on the capacitance of the emulator capacitor 306. Thus, in some implementations, the controller 310 is configured to adjust the capacitance of the emulator capacitor 306 based on the difference between the reference high current and the low side current signal ILS when the power switch 100 changes from the high state to the low state. For example, the comparator 326 may be coupled to the emulator capacitor 306 and configured to adjust the capacitance of the emulator capacitor 306 based on the output of the comparator 326. As a further example, the controller 310 may adjust the capacitance of the emulator capacitor 306 by an amount set based on the difference between the reference high current and the low side current signal ILS.

Figure 5:
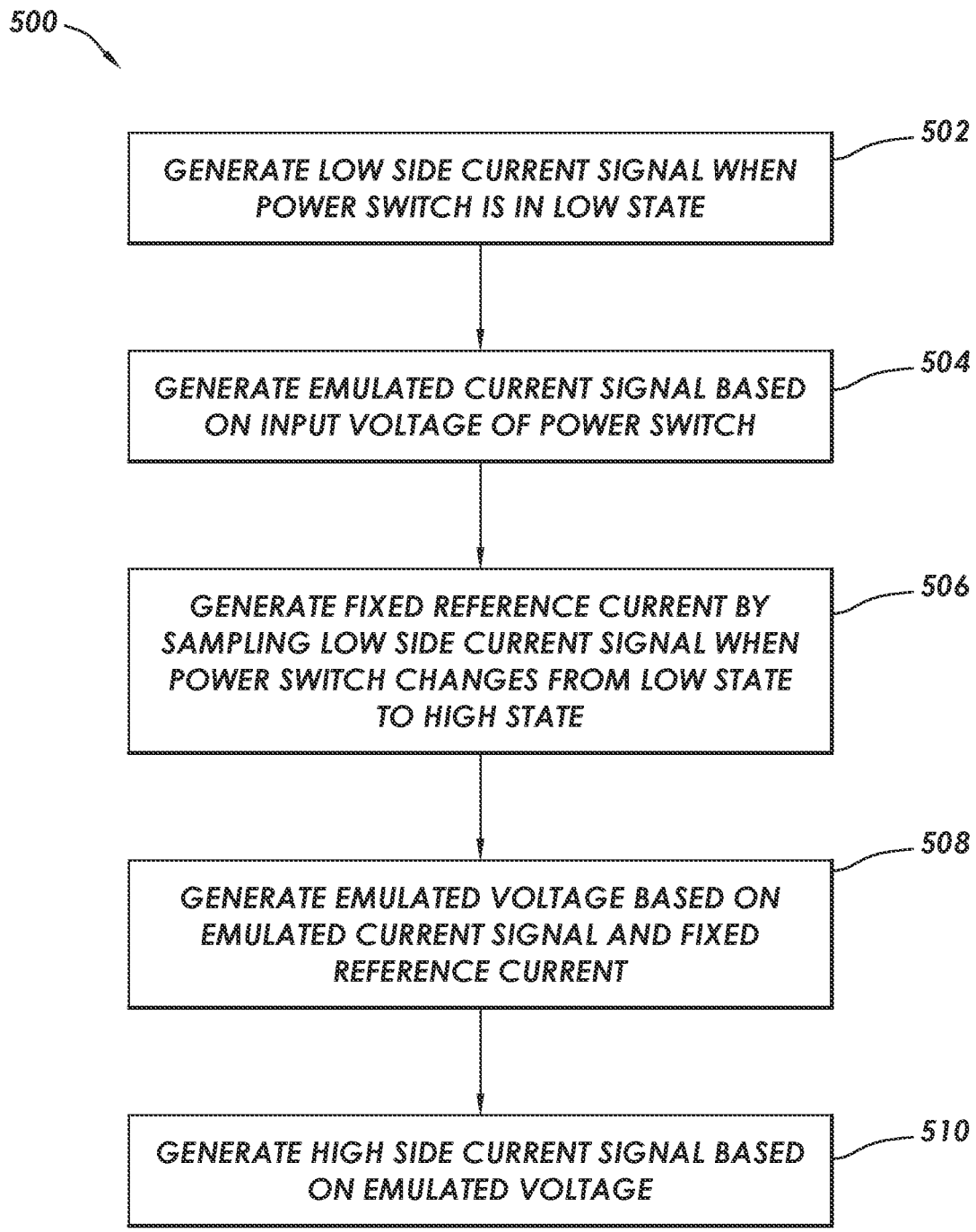
FIG. 5 is a flow diagram of an example of a method for emulating a high side current of a power switch in accordance with some implementations.

FIG. 5 is a flow diagram of an example of a method 500 for emulating a high side current of the power switch 100 in accordance with some implementations. At block 502, the low side current sensor 106 generates a low side current signal ILS when the power switch 100 is in a low state. At block 504, the first transconductance amplifier 302 generates an emulated current signal Iemu based on the input voltage Vin of the power switch 100. At block 506, the buffer 304 generates a fixed reference voltage by sampling the low side current signal ILS when the power switch 100 changes from the low state to a high state. At block 508, the emulator capacitor 306 generates an emulated voltage based on the emulated current signal Iemu and the fixed reference voltage. At block 510, the second transconductance amplifier 308 generates a high side current signal IHS based on the emulated voltage.

Figure 6:
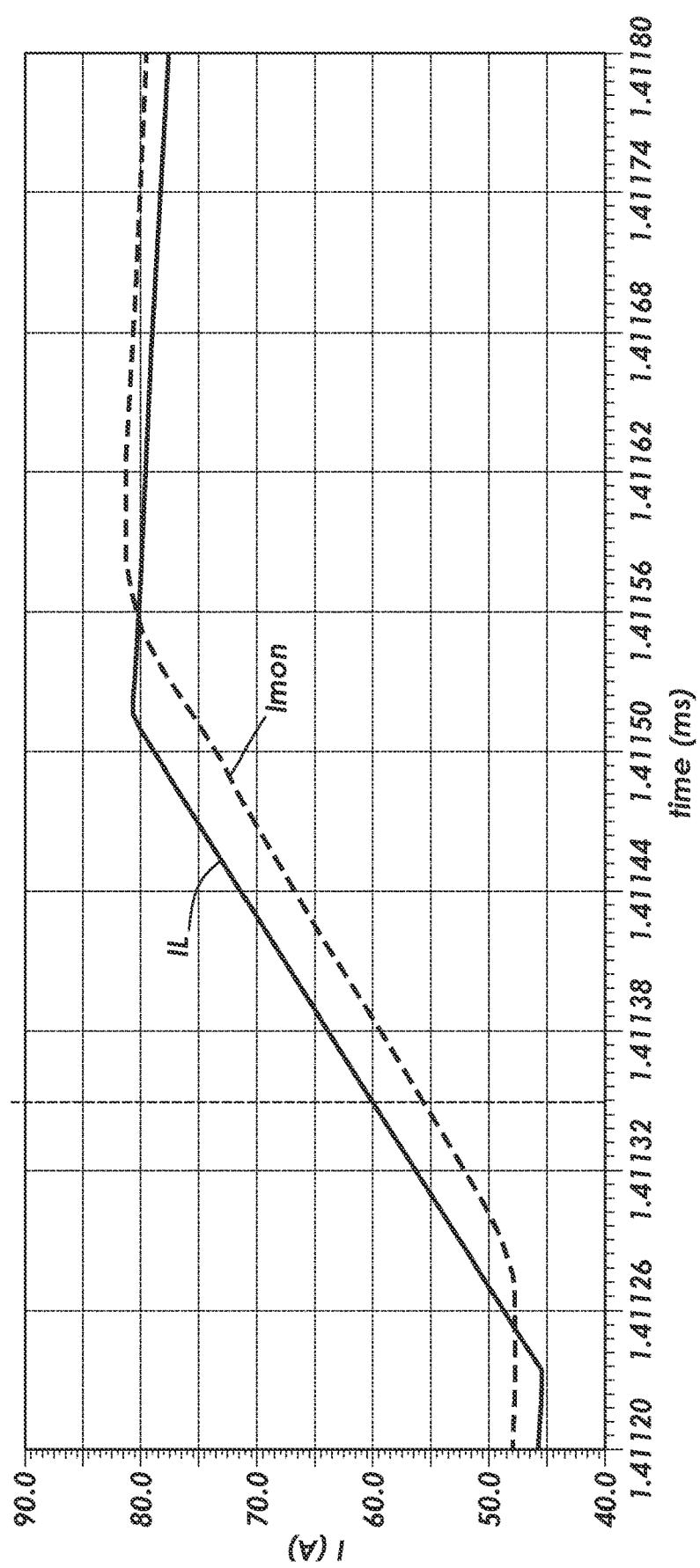
FIG. 6 is a plot of an example of a transient response of a conventional inductive current monitoring system.
Figure 7:
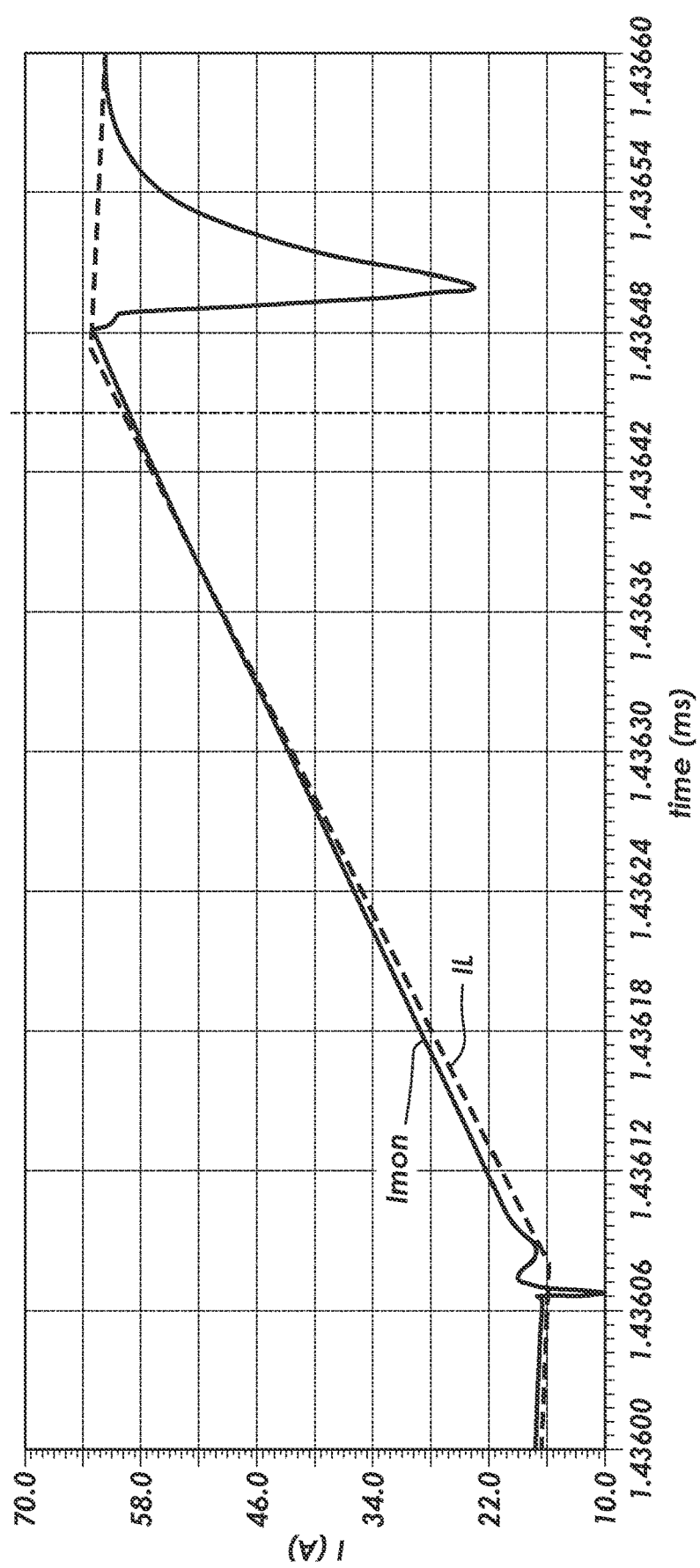
FIG. 7 a plot of an example of a transient response of a power switch with high side current emulation in accordance with some implementations.

FIG. 6 is a plot of an example of a transient response of a conventional inductive current monitoring system. As illustrated in FIG. 6, there is a significant phase delay between the load current (represented in FIG. 6 by the line IL) and the monitored current (represented in FIG. 6 by the line Imon). FIG. 7 a plot of an example of a transient response of the power switch 100 described herein. As illustrated in FIG. 7, the phase delay between the load current (represented in FIG. 7 by the line IL) and the monitored current (represented in FIG. 7 by the line Imon) is small.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. A method for emulating a high side current of a power switch including a low side switch and a high side switch, the method comprising:
    generating, with a low side current sensor, a low side current signal for the low side switch when the power switch is in a low state;
    generating, with a first transconductance amplifier, an emulated current signal based on an input voltage of the power switch;
    generating, with a buffer, a fixed reference voltage by sampling the low side current signal when the power switch changes from the low state to a high state;
    generating, with an emulator capacitor, an emulated voltage based on the emulated current signal and the fixed reference voltage; and
    generating, with a second transconductance amplifier, a high side current signal for the high side switch based on the emulated voltage.

2. The method of claim 1, further comprising:
    generating a reference high current by sampling the high side current signal when the power switch changes from the high state to the low state; and
    adjusting, with a controller, a transconductance of the first transconductance amplifier based on a difference between the reference high current and the low side current signal when the power switch changes from the high state to the low state.

3. The method of claim 2, wherein adjusting the transconductance of the first transconductance amplifier further includes:
    generating, with a comparator included in the controller, a comparison signal by comparing the reference high current to the low side current signal when the power switch changes from the high state to the low state, decreasing, with a counter included in the controller, the transconductance of the first transconductance amplifier when the comparison signal indicates that the reference high current is greater than the low side current signal, and increasing, with the counter, the transconductance of the first transconductance amplifier when the comparison signal indicates that the reference high current is less than the low side current signal.

4. The method of claim 2, wherein adjusting the transconductance of the first transconductance amplifier further includes:
  determining a difference value indicating the difference between the reference high current and the low side current signal when the power switch changes from the high state to the low state; and
  adjusting the transconductance of the first transconductance amplifier based on the difference value.

5. The method of claim 1, further comprising:
  generating a reference high current by sampling the high side current signal when the power switch changes from the high state to the low state; and
  adjusting, with a controller, a capacitance of the emulator capacitor based on a difference between the reference high current and the low side current signal when the power switch changes from the high state to the low state.

6. The method of claim 5, wherein adjusting the capacitance of the emulator capacitor further includes:
  generating, with a comparator included in the controller, a comparison signal by comparing the reference high current to the low side current signal when the power switch changes from the high state to the low state,
  increasing, with a counter included in the controller, the capacitance of the emulator capacitor when the comparison signal indicates that the reference high current is greater than the low side current signal, and
  decreasing, with the counter, the capacitance of the emulator capacitor when the comparison signal indicates that the reference high current is less than the low side current signal.

7. The method of claim 5, wherein adjusting the capacitance of the emulator capacitor further includes:
  determining a difference value indicating the difference between the reference high current and the low side current signal when the power switch changes from the high state to the low state; and
  adjusting the capacitance of the emulator capacitor based on the difference value.

8. A system for emulating a high side current of a power switch including a low side switch and a high side switch, the system comprising:
  a low side current sensor configured to generate a low side current signal for the low side switch when the power switch is in a low state; and
  a high side current emulator including:
    a first transconductance amplifier configured to generate an emulated current signal based on an input voltage of the power switch,
    a buffer configured to generate a fixed reference voltage by sampling the low side current signal when the power switch changes from the low state to a high state,
    an emulator capacitor configured to generate an emulated voltage based on the emulated current signal and the fixed reference voltage, and
    a second transconductance amplifier configured to generate a high side current signal for the high side switch based on the emulated voltage.

9. The system of claim 8, wherein the high side current emulator is configured to generate a reference high current by sampling the high side current signal when the power switch changes from the high state to the low state, and wherein the high side current emulator further includes a controller configured to adjust a transconductance of the first transconductance amplifier based on a difference between the reference high current and the low side current signal when the power switch changes from the high state to the low state.

10. The system of claim 9, wherein the controller includes:
  a comparator configured to generate a comparison signal by comparing the reference high current to the low side current signal when the power switch changes from the high state to the low state, and
  a counter configured to:
    decrease the transconductance of the first transconductance amplifier when the comparison signal indicates that the reference high current is greater than the low side current signal, and
    increase the transconductance of the first transconductance amplifier when the comparison signal indicates that the reference high current is less than the low side current signal.

11. The system of claim 9, wherein, to adjust the transconductance of the first transconductance amplifier, the controller is further configured to:
  determine a difference value indicating the difference between the reference high current and the low side current signal when the power switch changes from the high state to the low state, and
  adjust the transconductance of the first transconductance amplifier based on the difference value.

12. The system of claim 8, wherein the high side current emulator is further configured to generate a reference high current by sampling the high side current signal when the power switch changes from the high state to the low state, and wherein the high side current emulator further includes a controller configured to adjust a capacitance of the emulator capacitor based on a difference between the reference high current and the low side current signal when the power switch changes from the high state to the low state.

13. The system of claim 12, wherein the controller includes:
  a comparator configured to generate a comparison signal by comparing the reference high current to the low side current signal when the power switch changes from the high state to the low state, and
  a counter configured to:
    increasing, the capacitance of the emulator capacitor when the comparison signal indicates that the reference high current is greater than the low side current signal, and
    decreasing, the capacitance of the emulator capacitor when the comparison signal indicates that the reference high current is less than the low side current signal.

14. The system of claim 12, wherein, to adjust the capacitance of the emulator capacitor, the controller is further configured to:

determine a difference value indicating the difference between the reference high current and the low side current signal when the power switch changes from the high state to the low state, and adjust the capacitance of the emulator capacitor based on the difference value.

15. A power switch, comprising:

a low side switch;

a high side switch;

a low side current sensor configured to generate a low side current signal for the low side switch when the power switch is in a low state; and a high side current emulator configured to:
generate an emulated current signal based on an input voltage of the power switch,
generate a fixed reference voltage by sampling the low side current signal when the power switch changes from the low state to a high state,
generate an emulated voltage based on the emulated current signal and the fixed reference voltage, and
generate a high side current signal for the high side switch based on the emulated voltage.

16. The power switch of claim 15, wherein the high side current emulator includes a transconductance amplifier configured to generate the emulated current signal based on the input voltage of the power switch, and wherein the high side current emulator is further configured to:
generate a reference high current by sampling the high side current signal when the power switch changes from the high state to the low state, and
adjust a transconductance of the transconductance amplifier based on a difference between the reference high current and the low side current signal when the power switch changes from the high state to the low state.

17. The power switch of claim 16, wherein the high side current emulator is further configured to:
generate a comparison signal by comparing the reference high current to the low side current signal when the power switch changes from the high state to the low state, decrease the transconductance of the transconductance amplifier when the comparison signal indicates that the reference high current is greater than the low side current signal, and increase the transconductance of the transconductance amplifier when the comparison signal indicates that the reference high current is less than the low side current signal.

18. The power switch of claim 16, wherein, to adjust the transconductance of the transconductance amplifier, the high side current emulator is further configured to:
determine a difference value indicating the difference between the reference high current and the low side current signal when the power switch changes from the high state to the low state, and
adjust the transconductance of the transconductance amplifier based on the difference value.

19. The power switch of claim 15, wherein the high side current emulator includes an emulator capacitor configured to generate the emulated voltage based on the emulated current signal and the fixed reference voltage, and wherein the high side current emulator is further configured to:
generate a reference high current by sampling the high side current signal when the power switch changes from the high state to the low state, and
adjust a capacitance of the emulator capacitor based on a difference between the reference high current and the low side current signal when the power switch changes from the high state to the low state.

20. The power switch of claim 19, wherein the high side current emulator is further configured to:
generate a comparison signal by comparing the reference high current to the low side current signal when the power switch changes from the high state to the low state,
increase the capacitance of the emulator capacitor when the comparison signal indicates that the reference high current is greater than the low side current signal, and
decrease the capacitance of the emulator capacitor when the comparison signal indicates that the reference high current is less than the low side current signal.

* * * * *